United States Patent
Lai et al.

(10) Patent No.: US 7,164,229 B2
(45) Date of Patent: Jan. 16, 2007

(54) ORGANIC LIGHT DASH EMITTING DISPLAY

(75) Inventors: Wei-Chih Lai, Kaohsiung (TW); Chun-Huai Li, Pingtung Hsien (TW)

(73) Assignee: Au Optronics Corporation, Hsinchu (TW)

( * ) Notice: Subject to any disclaimer, the term of this patent is extended or adjusted under 35 U.S.C. 154(b) by 225 days.

(21) Appl. No.: 10/707,163

(22) Filed: Nov. 25, 2003

(65) Prior Publication Data

US 2004/0155574 A1 Aug. 12, 2004

(30) Foreign Application Priority Data

Feb. 11, 2003 (TW) ............... 92102731 A

(51) Int. Cl.
*H01J 1/62* (2006.01)
(52) U.S. Cl. ............ 313/500; 313/503; 313/505; 313/169.2; 313/169.3; 313/169.4; 315/169.3; 315/169.4; 257/59; 257/72; 257/758; 174/250; 174/260; 174/261; 174/267; 174/268

(58) Field of Classification Search ............ 315/169.3, 315/169.4, 169; 313/500, 503, 505, 169.3, 313/169.4, 169.2; 257/159, 72, 758; 174/250, 174/260, 261, 267, 268
See application file for complete search history.

(56) References Cited

U.S. PATENT DOCUMENTS

2002/0005696 A1 * 1/2002 Yamazaki et al. ....... 315/169.3

* cited by examiner

*Primary Examiner*—Nimeshkumar D. Patel
*Assistant Examiner*—Anthony Canning
(74) *Attorney, Agent, or Firm*—Jiang Chyun IP Office

(57) ABSTRACT

An organic light-emitting display is provided. The organic light-emitting display has a power line divided into multiple sets with a voltage terminal attached to the center of each power line set. Furthermore, all the voltage terminals are coupled to a power supply through a low resistance conductive material medium. With this setup, brightness imbalance between neighboring pixels is minimized.

14 Claims, 4 Drawing Sheets

ORGANIC LIGHT DASH EMITTING DISPLAY

CROSS REFERENCE TO RELATED APPLICATIONS

This application claims the priority benefit of Taiwan application serial no. 92102731, filed Feb. 11, 2003.

BACKGROUND OF INVENTION

1. Field of Invention

The present invention relates to an organic light-emitting display (OLED). More particularly, the present invention relates to an organic light-emitting display having a power line divided into multiple sets such that a voltage terminal is coupled to the center of each power line set and that the voltage terminals from various sets are all coupled to a power supply through a medium fabricated using a low resistant material.

2. Description of Related Art

One of the earliest recordings of dynamic images can be found in documentary movies. Later on, when the cathode ray tube (CRT) was invented, television is brought into each family. With the advent of the computer age, CRT is adopted as a display monitor for the desktop computer. Despite its popularity, the radiation gun design always poses some hazard to human health and increases the bulk of each unit. Thus, less bulky and less hazardous alternatives to the CRT are sought after.

Flat panel displays are the results of intensive research to reduce size and weight of each display. Many types of displays belong to this category. They include liquid crystal display (LCD), field emission display (FED), organic light-emitting display (OLED) and plasma display panel (PDP). Organic light-emitting display is a type of self-illuminating display also commonly referred to as organic electroluminescence display (OELD). Major characteristics of an OLED are: dc low voltage driven, high luminance, high efficiency, high contrast value and light. In addition, an OLED is capable of producing a spectrum of color including the three primary colors red (R), green (G), blue (B) as well as white. Hence, OLED has the greatest potential to become the dominant type in the next generation of flat panel displays. Aside from being thin, light, energy-saving, self-illuminating and having a high resolution, a device fabricated using the OLED technique also has a wide viewing angle, a brilliant color contrast and a relatively low cost of production. With these advantages, it has been broadly applied as a LCD or backlight in an indicator panel, a mobile phone, a digital camera and a personal digital assistant (PDA).

According to the driving method, OLED can be classified into passive matrix driven type and active matrix driven type. A passive matrix driven OLED has a rather simple structure and does not require any thin film transistor (TFT) to drive the circuit and hence has a lower production cost. However, the passive matrix OLED has only moderate resolution and poor displaying capacity. Furthermore, as size of the display panel is increased, energy consumption is increased and working life is shortened. On the other hand, active matrix OLED technique—can be applied to form a large display screen with a wider viewing angle, a higher luminance level and a quicker response. The only drawback is that it has a higher production cost than a passive matrix OLED.

According to the driving method, flat panel displays can be divided into voltage driving and current driving types. The voltage driving type is normally applied to the TFT-LCD. Different voltages are applied to the data lines to attain different gray levels so that a full panel of colors is produced. Voltage driven TFT-LCD is technically mature, operationally stable and non-expensive to implement. The current driving type is normally applied to an OLED. Different currents, instead of voltages, are applied to the data lines to attain different gray levels so that a full panel of color is produced.

In an active OLED, a large current will flow in power lines around the pixel array. In general, these power lines are fabricated from thin sheets of metal so that its resistance is usually large and hence may lead to a rather large voltage drop after the passage of a current across a short distance along the power line. However, the actual voltage applied to a pixel will affect the size of a current passing into the OLED and ultimately the luminance level of the pixel. Consequently, voltage differential across a power line often leads to a non-uniformity of pixel brightness level.

FIG. 1 is the simulated voltage drop along a power line in a conventional organic light-emitting display. As shown in FIG. 1, a power line 102 is coupled to a voltage terminal having a voltage $V_{dd}$. Assume a current I flows along the power line 102 due to the voltage $V_{dd}$ and the power line 102 is dissected into several sections with each section of the power line having a resistance R. As the current I flows along the power line 102, the voltage at a first secondary power line 104 is $V_{dd}$, the voltage at a second secondary power line 106 is $V_{dd}$–IR, the voltage at a third secondary power line 108 is $V_{dd}$–2IR and so on. In general, the nth (where n is a positive integer) secondary power line 110 will receive a voltage $V_{dd}$ nIR. When the voltage drop in the secondary power line is large, the voltage across the organic light-emitting diode in each pixel between the positive and the negative terminal will drop correspondingly. In other words, there is a great reduction in the current passing through the organic light-emitting diode leading to a considerable drop in the overall brightness level. Consequently, there will be considerable difference in luminance between the light-emitting diodes powered by the first secondary power line and the last secondary power line.

In addition, a plurality of voltage terminals can be used in the display panel to shorten the distance between the connected power lines and reduce the number of secondary power lines (that is, reduce the sum of current flowing through the power line). With this set up, voltage drop across each secondary power line will be reduced. FIG. 2 is the simulated voltage drop along another power line design in a conventional organic light-emitting display. In FIG. 2, the power lines are divided into four sets, a first power line set 202, a second power line set 204, a third power line set 206 and a fourth power line set 208. Each power line set is coupled to M (M is a positive integer) secondary power lines and N (N is a positive integer) secondary power lines. The terminal for each power line set is closer to the Nth secondary line (that is, farther away from the Mth secondary line). Assume the current flowing through each secondary power line in the group of M secondary power lines is I1 and the current flowing through each secondary power line in the group of N secondary power lines is I2. The voltage at the Mth secondary voltage will be $V_{dd}$–(M*I1*R) and the voltage at the Nth secondary voltage will be $V_{dd}$–(N*I2*R). Using the first power line set 202 and the second power line set 204 as an example, the voltage between the Nth secondary power line in the first set 202 and the Mth secondary power line in the second set 204 is considerable. Thus, with this setup, considerable non-uniformity in brightness level still exists between neighboring pixels in the panel.

SUMMARY OF INVENTION

Accordingly, one object of the present invention is to provide an organic light-emitting display (OLED), in which a power line is divided into isolated sets of power lines, voltage terminals are coupled to the center of each power line set and further commonly connect to a power supply through a low-resistance material. With this design, variation in the brightness level between neighboring pixels due to a voltage drop within each group of power lines is greatly reduced.

To achieve these and other advantages and in accordance with the purpose of the invention, as embodied and broadly described herein, the invention provides an organic light-emitting display. The organic light-emitting display (OLED) comprises a plurality of power line sets and a plurality of voltage terminals. Each power line set is isolated from one another. Moreover, each power line set is coupled to a plurality of secondary power lines. Each voltage terminal is coupled to the center of each power line set. Furthermore, each voltage terminal is coupled to a power supply that provides a voltage. A voltage applied to each power line set will generate an electric current that diverts through the secondary power lines for supplying the electric current needed to drive a plurality of pixels in the organic light-emitting display.

In the embodiment of this invention, the pixels are included in an array of organic light-emitting devices. Each pixel comprises a switching transistor, a driving transistor, a storage capacitor and a light-emitting device. The switching transistor has a first drain, a first gate and a first source. The first drain is coupled to a data line and the first gate is coupled to a scan line. The driving transistor has a second drain, a second gate and a second source. The second gate is coupled to the first source and the second source is connected to a ground. The storage capacitor has a first terminal and a second terminal. The first terminal is coupled to the first source and the second gate. The second terminal is connected to the ground and the second source. The light-emitting device has an anode and a cathode. The anode is coupled to one of the secondary power lines and the cathode is coupled to the second drain. The switching transistor and the driving transistor are thin film transistors and the light-emitting device is an organic light-emitting diode or a polymer light-emitting diode.

This invention also provides an alternative organic light-emitting display. The organic light-emitting display (OLED) comprises a plurality of power line sets and a plurality of voltage terminals. Each power line set is isolated from one another. Moreover, each power line set is coupled to a plurality of secondary power lines. Each voltage terminal is coupled to each power line set. Furthermore, each voltage terminal is coupled through a conductive material to a power supply. A voltage applied to each power line set will generate an electric current that diverts through the secondary power lines for supplying the electric current needed to drive a plurality of pixels in the organic light-emitting display.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
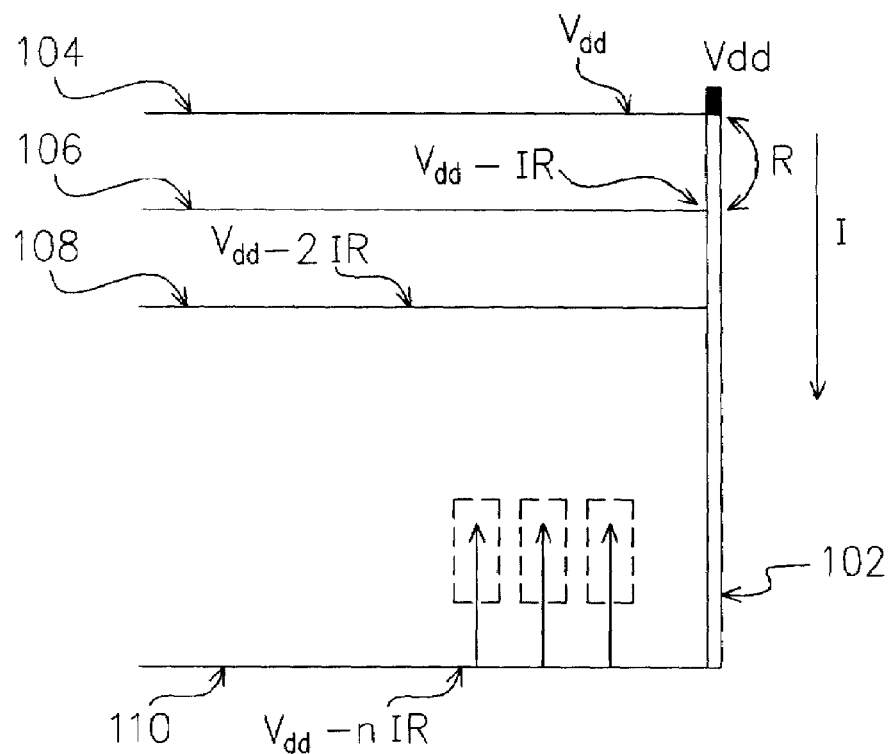
FIG. 1 is a schematic view illustrating a voltage drop along a power line in a conventional organic light-emitting display.
Figure 2:
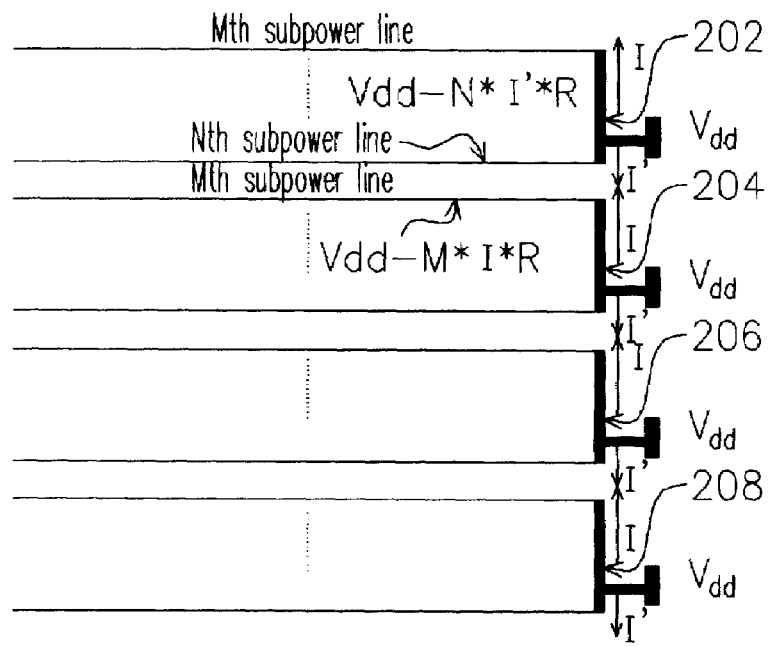
FIG. 2 is a schematic view illustrating a voltage drop along another power line design in a conventional organic light-emitting display.

Reference will now be made in detail to the present preferred embodiments of the invention, examples of which are illustrated in the accompanying drawings. Wherever possible, the same reference numbers are used in the drawings and the description to refer to the same or like parts.

Figure 3:
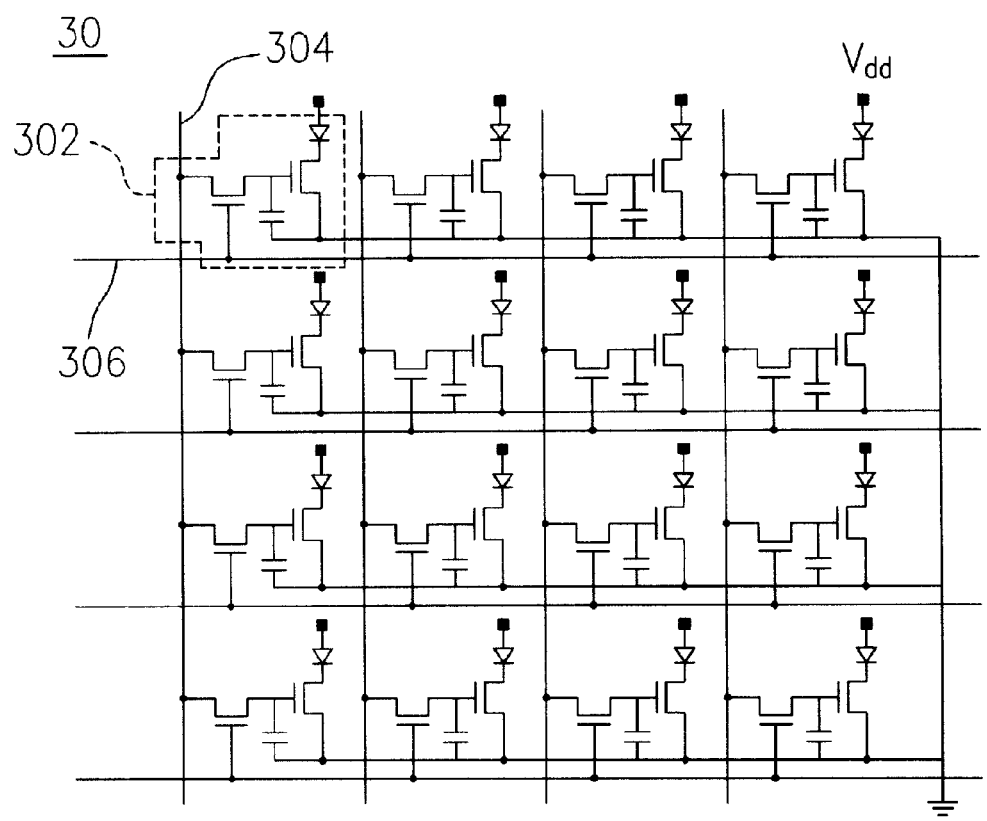
FIG. 3 is a schematic layout of a pixel array implemented in an organic light-emitting display according to an embodiment of this invention.

The organic light-emitting display (OLED) in this invention is of an active matrix type. FIG. 3 is a schematic layout of pixel array in an organic light-emitting display according to an embodiment of this invention. The pixel array 30 comprises of a plurality of pixels 302, a plurality of data lines 304 and a plurality of scan lines 306.

Figure 4:
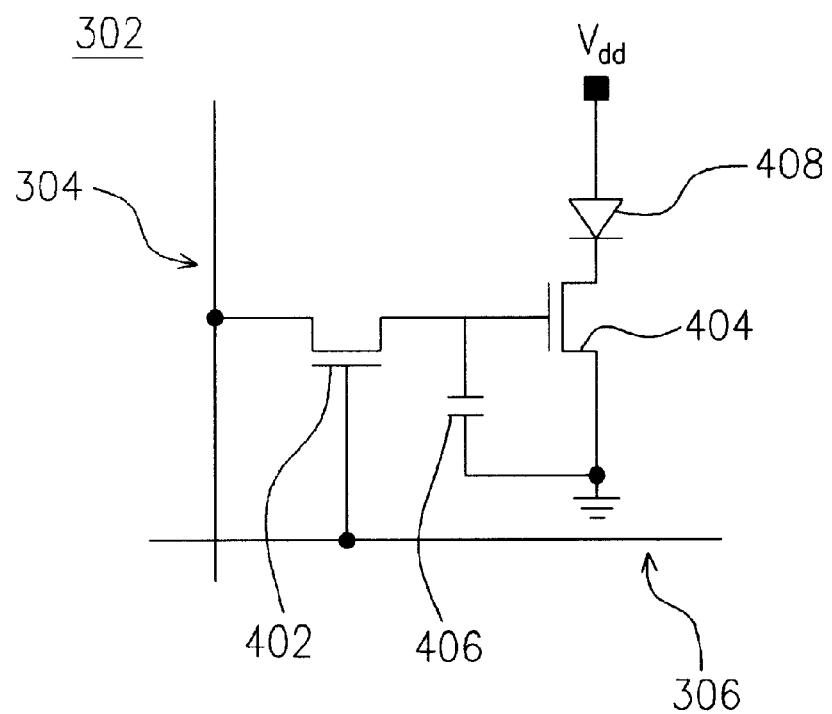
FIG. 4 is a circuit diagram of a pixel structure in an organic light-emitting display according to an embodiment of this invention.

FIG. 4 is a circuit diagram of a pixel structure implemented in an embodiment of the invention. The pixel 402 comprises a switching transistor 402, a driving transistor 404, a storage capacitor 406 and a light-emitting device 408. The switching transistor 402 has a drain terminal, a gate terminal and a source terminal. Similarly, the driving transistor 404 has a drain terminal, a gate terminal and a source terminal. The storage capacitor 406 has a first terminal and a second terminal. The light-emitting device 408 has an anode and a cathode. The drain terminal of the switching transistor 402 is coupled to the data line 304, and the gate terminal of the switching transistor 402 is coupled to the scan line 306. The source terminal of the switching transistor 402 is coupled to the gate terminal of the driving transistor 404, and the first terminal of the storage capacitor 406. The drain terminal of the driving transistor 404 is coupled to the cathode of the light-emitting device 406. The source terminal of the driving transistor 404 is grounded and connects to the second terminal of the storage capacitor 406. The anode of the light-emitting device 408 is coupled to a secondary power line. The secondary power line is coupled through a power line to a power voltage $V_{dd}$. The switching transistor 402 and the driving transistor 404 can be, for example, thin film transistors. The light-emitting device 408 can be, for example, an organic light-emitting diode or a polymer light-emitting diode. If there is a voltage drop across the secondary power line, the amount of electric current supplied to the light-emitting device 408 will be affected, which adversely causes a slight variation in the brightness level of the pixel 302.

Figure 5:
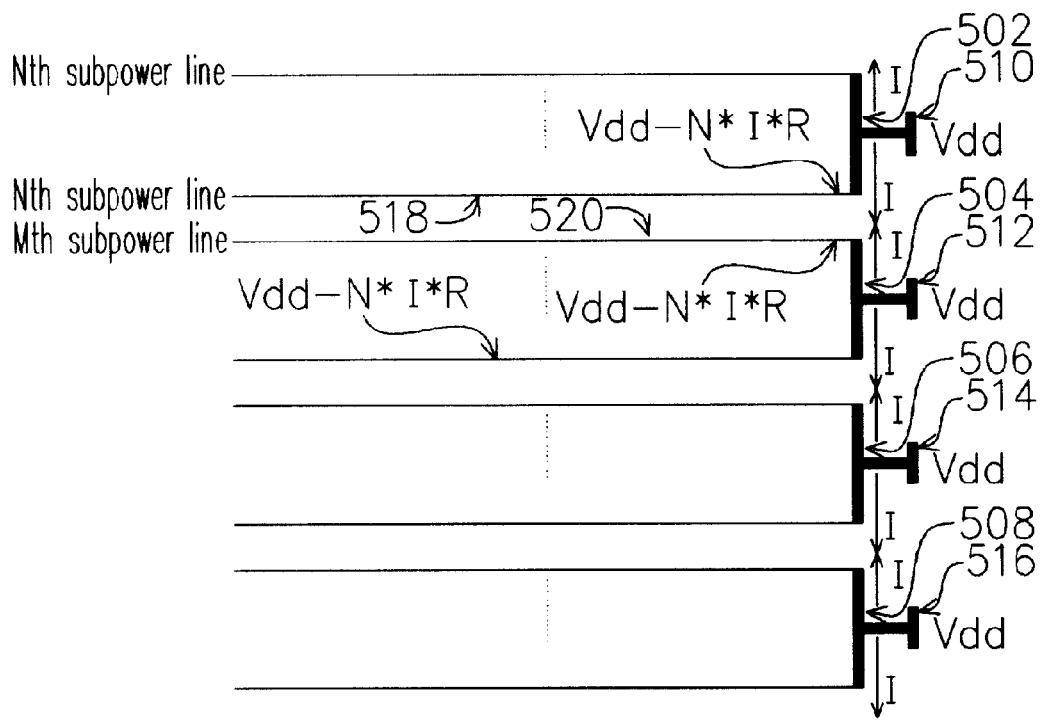
FIG. 5 is a schematic diagram illustrating a voltage drop along a power line in an organic light-emitting display according to one embodiment of this invention.

FIG. 5 is a schematic view showing a voltage drop along a power line in an organic light-emitting display according to one embodiment of this invention. The OLED comprises a plurality of power line sets and a plurality of voltage terminals. For the sake of simplified illustration, only four sets of power lines and four voltage terminals are illustrated. As shown in FIG. 5, the four sets of power lines, including a first power line set 502, a second power line set 504, a third power line set 506 and a fourth power line set 508, are isolated from one another. Each set of power line is coupled to 2N (where N is a positive number) secondary power lines. The electric current derived from the application of a power voltage $V_{dd}$ to each set of power lines diverts into each secondary power line, and flow into the pixels linked up with a particular secondary power line. The voltage terminal 510 is coupled to the center of the first power line set 502, the voltage terminal 512 is coupled to the center of the second power line set 504, the voltage terminal 514 is coupled to the center of the third power line set 506, and the voltage terminal 516 is coupled to the center of the fourth power line set 508. Each voltage terminal (510, 512, 514, 516) is also connected to a power supply that provides a power voltage $V_{dd}$. If an electric current I passes through each of the N secondary power line, the voltage at the Nth secondary power line is $V_{dd}-(N*I*R)$. Using the first power line set 502 and the second power line set 504 as examples, the respective voltages at the last secondary power line 518 of the first set 502 and the first secondary power line 520 of the second set 504 are both Vdd (N*I*R). Therefore, the difference in brightness between neighboring pixels in the display panel is greatly minimized.

Figure 6:
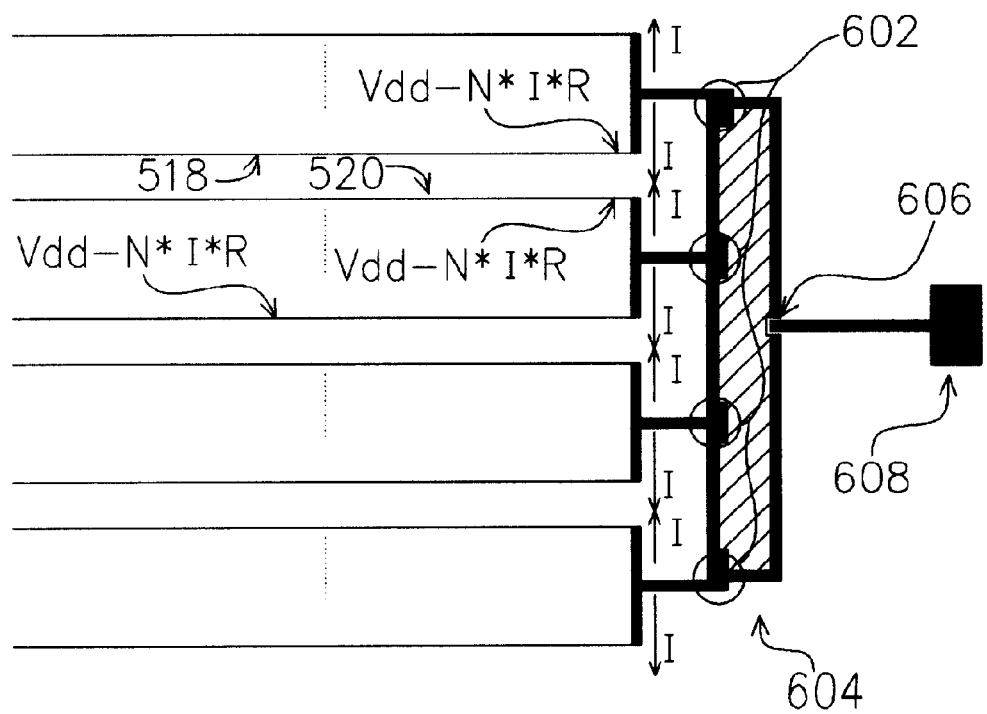
FIG. 6 is a diagram showing a conventional connection between the voltage terminals of an OLED and a power supply.

FIG. 6 is a schematic diagram showing a conventional connection structure between the voltage terminals of an OLED and a power supply. Voltage terminals 602 are connected to a metallic wire 604 provided on the OLED panel. The metallic wire 604 is connected through a common contact terminal 606 to a power supply 608. Since the metallic wire 604 has a relatively high ohmic resistance, the supply of a large electric current is usually required, which results in considerable power waste and further creates a steep voltage drop. To reduce the ohmic resistance of the metallic wire 604, the width of the metallic wire 604 can be increased. However, widening the metallic wire 604 leaves a smaller area in the display panel for forming other useful devices.

Figure 7:
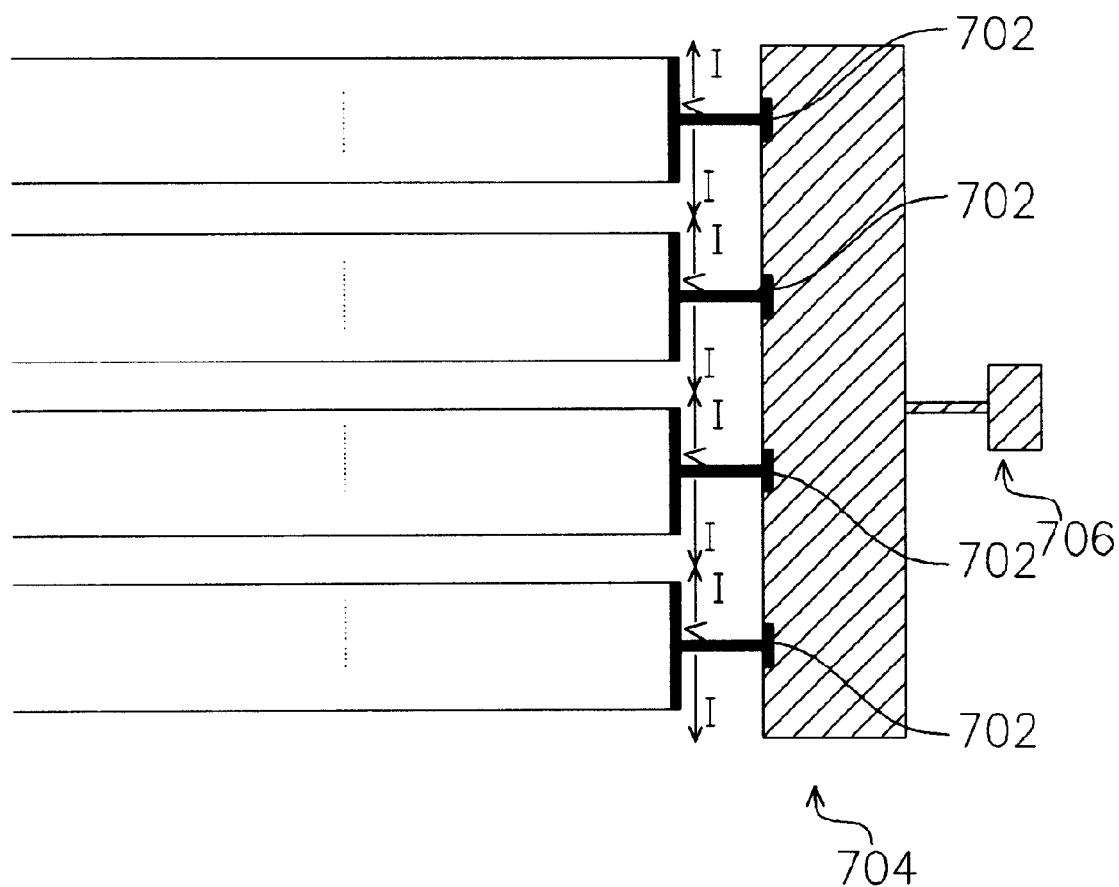
FIG. 7 is a diagram showing a connection between the voltage terminals of an OLED and a power supply according to one embodiment of this invention.

To overcome the above deficiencies, each of the voltage terminals is in contact with a common low-resistance conductive interface. FIG. 7 is a schematic diagram showing a connection structure between the voltage terminals of an OLED and a power supply according to one embodiment of this invention. A conductive interface 704 of low-resistance material is placed in connection between voltage terminals 702 and a power supply 706. Voltage drop between the power supply 706 and the voltage terminals 702 is thereby reduced to a small amount, resulting in less power waste. Being externally connected, the conductive material interface 704 does not occupy any panel area.

In summary, the power line region is grouped into power line sets in this invention, and each voltage terminal is coupled to the center of each power line set. In addition, all the voltage terminals are coupled to a power supply unit through a low resistant conductive medium. Thus, non-uniform brightness between pixels due to a voltage drop across each power line set is minimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. An organic light-emitting display (OLED), comprising:
   a plurality of power line sets isolated from each other, wherein each power line set is coupled to a plurality of secondary power lines; and
   a plurality of voltage terminals, wherein each voltage terminal is coupled to a middle region of a corresponding one of the power line sets, and the voltage terminals are coupled to a power supply, wherein the corresponding one of the power line sets has two end regions on both sides of the middle region and the two end regions are larger than the middle region,
   wherein an electric current resulting from a voltage applied to each power line set passes through the secondary power lines into a plurality of corresponding pixels in the organic light-emitting display.

2. The OLED of claim 1, wherein the pixels are arranged in a pixel array.

3. The OLED of claim 1, wherein each pixel comprises:
   a switching transistor having a first drain terminal, a first gate terminal and a first source terminal, wherein the first drain terminal is coupled to a data line and the first gate terminal is coupled to a scan line;
   a driving transistor having a second drain terminal, a second gate terminal and a second source terminal, wherein the second gate terminal is coupled to the first source terminal and the second source terminal is connected to ground;
   a storage capacitor having a first terminal and a second terminal, wherein the first terminal is coupled to the first source terminal and the second gate terminal and the second terminal is connected to ground and the second source terminal; and
   a light-emitting device having an anode and a cathode, wherein the anode is coupled to one of the secondary power lines and the cathode is coupled the second drain terminal.

4. The OLED of claim 3, wherein the switching transistor and the driving transistor comprise thin film transistors.

5. The OLED of claim 3, wherein the light-emitting device comprises an organic light-emitting diode.

6. The OLED of claim 3, wherein the light-emitting device comprises a polymer light-emitting diode.

7. An organic light-emitting display (OLED), comprising:
   a plurality of power line sets isolated from one another, wherein each power line set is coupled to a plurality of secondary power lines; and
   a plurality of voltage terminals, wherein each voltage terminal is coupled to a power line set, and the voltage terminals are coupled through a conductive material medium to a power supply;
   wherein an electric current resulting from a voltage applied to each power line passes through the secondary power lines into a plurality of corresponding pixels in the organic light-emitting display.

8. The OLED of claim 7, wherein the pixels are arranged in a pixel ray.

9. The OLED of claim 7, wherein each pixel furthermore comprises:

a switching transistor having a first drain terminal, a first gate terminal and a first source terminal, wherein the first drain terminal is coupled to a data line and the first gate terminal is coupled to a scan line;

a driving transistor having a second drain terminal, a second gate terminal and a second source terminal, wherein the second gate terminal is coupled to the first source terminal and the second source terminal is connected to ground;

a storage capacitor having a first terminal and a second terminal, wherein the first terminal is coupled to the first source terminal and the second gate terminal and the second terminal is connected to ground and the second source terminal; and a light-emitting device having an anode and a cathode, wherein the anode is coupled to one of the secondary power lines and the cathode is coupled the second drain terminal.

10. The OLED of claim 9, wherein the switching transistor and the driving transistor comprise thin film transistors.

11. The OLED of claim 9, wherein the light-emitting device comprises an organic light-emitting diode.

12. The OLED of claim 9, wherein the light-emitting device comprises a polymer light-emitting diode.

13. The OLED of claim 7, wherein the conductive material medium is a conductive material interface in external connection.

14. The OLED of claim 7, wherein each voltage terminal is coupled to a center of a corresponding one of the power line sets.

* * * * *